United States Patent
Yauw et al.

(10) Patent No.: US 6,599,437 B2
(45) Date of Patent: Jul. 29, 2003

(54) METHOD OF ETCHING ORGANIC ANTIREFLECTION COATING (ARC) LAYERS

(75) Inventors: Oranna Yauw, Sunnyvale, CA (US); Meihua Shen, Fremont, CA (US); Nicolas Gani, Milpitas, CA (US); Jeffrey D. Chinn, Foster City, CA (US)

(73) Assignee: Applied Materials Inc., Santa Clara, CA (US)

( * ) Notice: Subject to any disclaimer, the term of this patent is extended or adjusted under 35 U.S.C. 154(b) by 143 days.

(21) Appl. No.: 09/813,392

(22) Filed: Mar. 20, 2001

(65) Prior Publication Data

US 2003/0029835 A1 Feb. 13, 2003

(51) Int. Cl.$^7$ .......................................... H01L 21/3213
(52) U.S. Cl. ........................ 216/47; 216/49; 216/67; 216/72; 438/695; 438/696; 438/710; 438/714; 438/725; 252/79.1
(58) Field of Search ........................ 216/47, 49, 67, 216/72; 438/695, 696, 710, 714, 725; 252/79.1

(56) References Cited

U.S. PATENT DOCUMENTS

| | | | |
|---|---|---|---|
| 4,919,748 A | 4/1990 | Bredbenner et al. | 156/643 |
| 5,772,906 A | 6/1998 | Abraham | 216/72 |
| 5,910,453 A | 6/1999 | Gupta et al. | 438/717 |
| 6,001,538 A | 12/1999 | Chen et al. | 430/316 |
| 6,004,850 A | 12/1999 | Lucas et al. | 438/301 |
| 6,004,853 A | 12/1999 | Yang et al. | 438/305 |
| 6,013,582 A | 1/2000 | Ionov et al. | 438/738 |
| 6,040,248 A * | 3/2000 | Chen et al. | 438/725 |
| 6,136,676 A * | 10/2000 | Saito | 438/587 |
| 6,156,485 A * | 12/2000 | Tang et al. | 430/313 |
| 6,156,629 A * | 12/2000 | Tao et al. | 438/535 |

FOREIGN PATENT DOCUMENTS

| | | | |
|---|---|---|---|
| EP | EP 0820093 A1 | 1/1998 | H01L/21/311 |
| EP | EP 0859400 A2 | 8/1998 | H01L/21/027 |

OTHER PUBLICATIONS

U.S. patent application Ser. No. 09/611,085. "Method of Etching Organic Arcs in *Patterns Having Variable Spacings.*"

* cited by examiner

*Primary Examiner*—Shrive P. Beck
*Assistant Examiner*—Allan Olsen
(74) *Attorney, Agent, or Firm*—Shirley L. Church; Kathi Bean; Joseph Bach

(57) ABSTRACT

A two-step method of etching an organic coating layer, in particular, an organic antireflection coating (ARC) layer, is disclosed. During the main etch step, the organic coating layer is etched using a plasma generated from a first source gas which includes a fluorocarbon and a non-carbon-containing, halogen-comprising gas. Etching is performed using a first substrate bias power. During the overetch step, residual organic coating material remaining after the main etch step is removed by exposing the substrate to a plasma generated from a second source gas which includes a chlorine-containing gas and an oxygen-containing gas, and which does not include a polymer-forming gas. The overetch step is performed using a second substrate bias power which is less than the first substrate bias power. The first source gas and first substrate bias power provide a higher etch rate in dense feature areas than in isolated feature areas during the main etch step, whereas the second source gas and second substrate bias power provide a higher etch rate in isolated feature areas than in dense feature areas during the overetch step, resulting in an overall balancing effect.

36 Claims, 7 Drawing Sheets

METHOD OF ETCHING ORGANIC ANTIREFLECTION COATING (ARC) LAYERS

BACKGROUND OF THE INVENTION

1. Field of the Invention

The present invention pertains to a method of etching organic antireflection coatings (ARCs), and in particular, bottom antireflection coatings (BARCs). Organic antireflection coatings, as indicated by their name, include carbon and hydrogen-containing materials, and are typically polymeric in nature. The antireflection coatings are part of an etch stack which is used to produce semiconductor devices, and they are pattern etched to submicron dimensions. The present method permits control over shifts in the critical dimension of the etched feature size, while providing uniform etching of ARCs across the entire surface of a semiconductor substrate, despite variation in spacing between features across the substrate surface.

2. Brief Description of the Background Art

In the field of semiconductor device fabrication, it is well recognized that as device feature sizes decrease to about 0.18 µm and smaller, mask patterning via photoresist materials requires the use of deep ultra violet wavelength (DUV) imaging radiation. Antireflective coatings are used in combination with DUV photoresists, among other photoresists, to reduce standing waves and back-scattered light, so that the dimensions of the patterning in the photoresist can be better controlled.

Generally, the photoresist is applied over a stack of other layers which are patterned as a part of the semiconductor device fabrication process. Some of the layers in the stack are consumed during the process of patterning underlying layers which become part of the functioning device. An ARC layer may be present at a number of different locations within a stack of layers, depending on the application. When the ARC layer is applied over the top of a layer stack, it is referred to as a top antireflective coating (TAR). When the ARC layer lies beneath the photoresist layer, it is commonly referred to as a bottom antireflective coating (BARC). TAR coatings are frequently removed during the photoresist patterning (developing) process, while BARC layers most often require a dry etching removal step.

Processes for the dry etching of organic ARCs usually are accomplished in a plasma etch system. ARC etching plasma source gases vary considerably in composition. Some examples of plasma source gas combinations include $CHF_3/CF_4/Ar$—$O_2$; $CF_4/He$—$O_2$; $O_2/N_2$; $HBr/O_2$; and $HBr/CO_2/O_2$—Ar.

In one process for etching organic antireflective coatings overlying a silicon-containing substrate, the substrate is placed into a process chamber and treated with a plasma. The plasma is generated from a process gas comprising oxygen and a compound selected from a group of compounds consisting of hydrogen and bromine-containing compounds, hydrogen and iodine-containing compounds, and mixtures thereof. Processing variables are adjusted to provide anisotropic etching of the organic antireflective coating.

In another etching process, an anti-reflection coating overlying a semiconductor substrate is etched by employing a plasma formed from a mixture of oxygen, nitrogen, and at least one inert gas. In an alternative method, the antireflective coating layer may be etched by employing a nitrogen plasma, which includes an inert gas, without any oxygen in the plasma, although the etch rate is said to be reduced.

Another method for plasma etching a BARC layer overlying a semiconductor substrate utilizes etch chemistry provided by a plasma processing gas which includes hydrogen bromide (HBr), $CO_2$, and $O_2$, with argon or another inert gas.

More information regarding the kinds of processes described above may be found in European Patent Publication No. EP 0820093, of Zhao et al., published Jan. 21, 1998; U.S. Pat. No. 5,910,453, to Gupta et al., issued Jun. 8, 1999; and European Patent Application No. EP 0859400, of Yang et al., published Aug. 19, 1998.

Uniformity of etching across a wafer has long been a concern, and, in general, the references pertaining to etching of organic antireflective coating layers place great emphasis on maintenance of the critical dimension of the feature being etched, such as a line width, contact pad dimension, gate size, and so on. Emphasis is also placed on the selectivity of the etch process, where the etch rate of an ARC layer is compared with the etch rate of an adjacent layer of material, such as a silicon-containing layer underlying the ARC layer, for example.

A very important variable, which has become more important with decreasing critical dimension size of etched features, is the etched feature critical dimension uniformity control across a substrate, such as a semiconductor wafer. For example, when the pattern being etched into an ARC layer is a series of lines and spaces, and the spacing between the lines is different at different positions on the substrate surface, the etch rate of the ARC may vary at different positions on the substrate surface. This may affect the depth of etch and may affect the profile of the feature being etched. It also affects the critical dimension uniformity across the substrate. The phenomenon of a change in overall etch performance across a substrate surface as a function of the spacing between etched features is sometimes referred to as a "microloading" effect. Differences in etch rate and/or etched feature profile occur in part because the availability of etchant species at a given position on the substrate surface varies, and the amount of etch byproduct which is produced varies as well. One of the reasons that the availability of etchant species and byproduct residue varies across a wafer surface is that the input and distribution of processing gases and the removal of processing gases and etch byproducts from the processing chamber is frequently not uniform. Another reason is that there is different spacing between pattern features at different locations (positions) on the substrate surface. Etch byproducts tend to be generated by two different mechanisms: 1) the use of etchant gas compositions which contain significant amounts of passivating gases (e.g., $N_2$, or polymer-generating gases, such as carbon-containing gases), and/or 2) back-sputtering of etched material onto feature sidewalls during etching. Etchant gas-generated passivation layers (1) tend to build up on feature sidewalls relatively evenly over the substrate surface. Back-sputtered passivation layers (2) tend to deposit more on isolated feature areas of the substrate, where there is more back-sputtering because the amount of material being etched tends to be greater than in dense feature areas of the substrate.

Commonly owned, copending U.S. application Ser. No. 09/611,085, of Shen et al., discloses a process for plasma etching of ARC layers which is said to provide critical dimension uniformity across a substrate surface. The ARC etching process utilizes $CF_4$, HBr, and $O_2$ chemistry.

However, while this process provides excellent critical dimension uniformity across a substrate surface during etching of 1500 Å thick BARC layers, critical dimension uniformity is not as good when the process is used to etch thicker (e.g., 2000 Å) BARC layers. This is believed to be due to the longer etch time needed to etch a thicker BARC layer. Therefore, it would be desirable to provide a process for etching a BARC layer that would provide excellent critical dimension uniformity across a substrate surface, when etching thicker (>1500 Å thickness) BARC layers.

SUMMARY OF THE INVENTION

The present invention includes a method of etching organic coating layers, and in particular, antireflective coating layers. The method provides improved critical dimension uniformity of the etched feature across the substrate surface, while providing selectivity favoring etching of the antireflective coating layer relative to an underlying silicon-containing layer. The present method has been shown to provide excellent critical dimension uniformity during etching of thicker (>1500 Å) organic coating layers.

We have discovered a method for etching an organic coating layer which provides unexpected control over the etched feature critical dimension, as well as the critical dimension uniformity across a substrate surface (CD shift range), despite a difference in the spacing between etched features over the substrate surface.

A two-step method is used to etch an organic coating layer. The first step of the method is a main etch step, during which essentially the entire thickness of the organic coating layer is etched to endpoint. The main etch utilizes a plasma generated from a first source gas comprising a fluorocarbon gas and a non-carbon-containing, halogen-comprising gas.

The second step of the method is an overetch step, during which residual coating layer material remaining on feature surfaces following the main etch step is removed. The overetch step utilizes a plasma generated from a second source gas comprising a chlorine-comprising gas, an oxygen-comprising gas, and an inert gas (i.e., a noble gas). This chemistry provides excellent (>20:1) selectivity for etching the organic coating layer relative to an underlying silicon-containing layer. Power applied to bias the substrate during the overetch step is less than the power applied to bias the substrate in the main etch step.

With reference to a pattern of lines and spaces (by way of example and not limitation), the etch chemistry and process conditions used in the main etch step produces a smaller etched line width in dense areas (where features are spaced closer together) than the etched line width in isolated areas (where features are spaced further apart). Typically, the etched line width in both the dense areas and the isolated areas is smaller than the line width of the photoresist used to pattern the organic coating layer (such as an ARC). This reduction in line width from the target line width is referred to as a "negative CD shift" or a "CD loss". Thus, the negative CD shift is greater in the dense areas than in the isolated areas during the main etch. The negative CD shift across the substrate is referred to as the "CD shift range".

As discussed above, the total amount of material being etched in isolated areas is greater than in dense areas; therefore, more polymeric material redeposits and builds up on isolated feature sidewalls during etching. This polymeric material build-up forms passivation layers which inhibit sidewall etching and slow the etch rate of isolated features. Further, the chemistry used in the main etch step includes $CF_4$, which forms polymers which contribute to the build-up of passivation layers on isolated feature sidewalls during etching.

The etch chemistry and process conditions used in the overetch step produce a negative CD shift in the isolated areas which is greater than the negative CD shift in the dense areas. This is the opposite of the effect observed during the main etch step. Because most of the organic coating layer material has already been etched in the main etch step, build-up of passivation layers in isolated areas due to polymer deposition is no longer as much of a factor in the overetch step as it was during the main etch step. Further, the etch chemistry used in the overetch step does not include a polymer-producing (passivating) plasma source gas.

Another important processing variable is the substrate bias power used in the main etch step compared with the overetch step. The power applied to the substrate is lower in the overetch step than in the main etch step. As a result, there is less driving force to direct etchant species toward the substrate surface during the overetch step, which tends to slow the etch rate. This effect is more pronounced in dense feature areas than in isolated areas, because the narrower spacing between features in dense areas (higher aspect ratio) tends to protect exposed etched sidewall features from impacting reactive species. Therefore, the combination of etch chemistry and application of less substrate bias in the overetch step produces more rapid etching in isolated feature areas than in dense areas during the overetch step. Thus, there is a balancing effect when the main etch step is combined with the overetch step. This balancing effect reduces the CD shift range.

In summary, the present invention utilizes multiple etching steps which compensate for each other and take advantage of different mechanisms to achieve uniformity of etching across a substrate surface. Accordingly, disclosed herein is a method of etching an organic coating layer on a semiconductor substrate which utilizes a combination of the etch chemistries and substrate bias powers used in the main etch and overetch steps to balance etching in dense and isolated areas of a semiconductor substrate.

DETAILED DESCRIPTION OF THE PREFERRED EMBODIMENTS

Figure 1A:
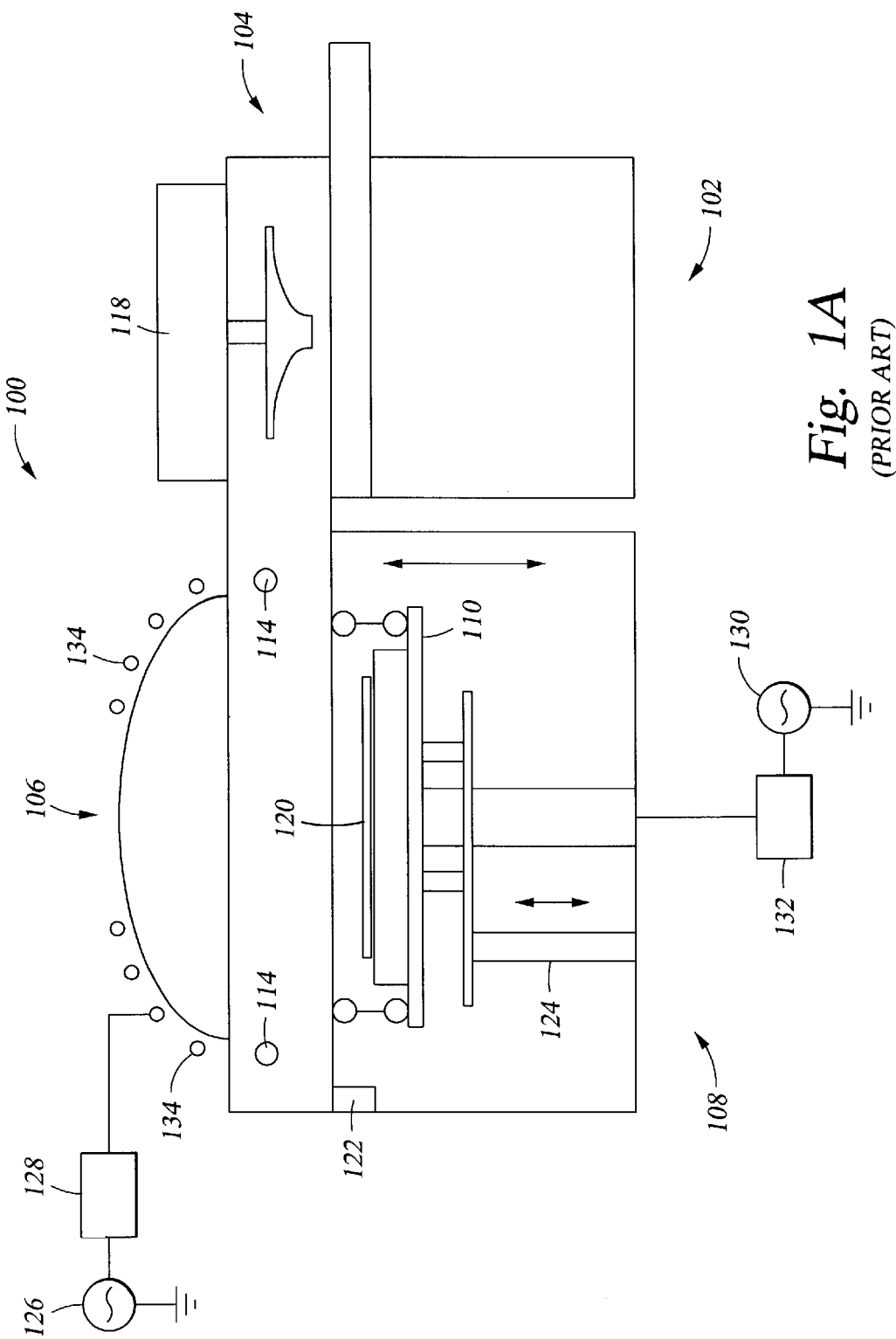
FIG. 1A shows a schematic of a preferred embodiment plasma processing apparatus of the kind which can be used to carry out the etching processes described herein.

The present disclosure provides a two-step method of etching an organic coating layer, such as an organic antireflection coating (ARC) layer. The method provides excellent critical dimension (CD) uniformity across a substrate surface, despite a variation in spacing between features across the substrate surface.

The first step of the method is a main etch step, during which essentially the entire thickness of the organic coating layer is etched to endpoint. The main etch utilizes a plasma generated from a first source gas comprising a fluorocarbon gas and a non-carbon-containing, halogen-comprising gas. The fluorocarbon gas is typically $CF_4$, but may alternatively be, for example, $CHF_3$, $CH_2F_2$, $C_2F_6$, $C_4F_8$, or a combination thereof. The non-carbon-containing, halogen-comprising gas is typically $Cl_2$, but may alternatively be, for example, HBr, HCl, or any combination of $Cl_2$, HBr, and/or HCl.

A first source gas comprising $CF_4$ and $Cl_2$ works particularly well. Typically, the volumetric ratio of $CF_4$:$Cl_2$ in the first source gas ranges from about 1:1 to about 6:1, preferably, from about 2:1 to about 5:1. If needed, a minor amount of a passivating gas, such as $N_2$ or HBr, may be included in the $CF_4$/$Cl_2$ source gas combination.

In an alternative, less preferred embodiment of the invention, a first source gas comprising $CF_4$, HBr, and $O_2$ may be used to perform the main etch step. This particular combination of main etch plasma source gases produces an increase in the negative CD shift in comparison with the $CF_4$/$Cl_2$ source gas combination.

A substrate bias power within the range of about 30 W to about 90 W is typically used during the main etch step.

The etch chemistry and process conditions used during the main etch step provide a higher etch rate in dense feature areas than in isolated feature areas of a semiconductor substrate.

The second step of the method is an overetch step, during which residual coating layer material remaining on feature surfaces following the main etch step is removed.

The overetch step utilizes a plasma generated from a second source gas comprising a chlorine-comprising gas, an oxygen-comprising gas, and an inert gas (i.e., a noble gas). The chlorine-comprising gas is typically $Cl_2$. The chlorine-comprising gas is typically $Cl_2$, but may alternatively be, for example, HCl. The oxygen-comprising gas is typically $O_2$, which may be provided as He/$O_2$ (where $O_2$ is about 30 volume % of the He/$O_2$ mixture). The inert gas is typically argon, but may alternatively be a different noble gas, for example, helium, neon, xenon, krypton, or the inert gas may be a combination of noble gases. Typically, the volumetric ratio of $Cl_2$:$O_2$ in the second source gas ranges from about 2:3 to about 3:1, preferably, from about 1:1 to about 3:1. In addition, the argon in the second source gas typically ranges from about 20 volume % to about 80 volume %, preferably, from about 30 volume % to about 50 volume %.

The substrate bias power used in the overetch step is lower than that used in the main etch step. An overetch substrate bias power that is less than 80%, and preferably less than 70%, of the substrate bias power used in the main etch step works particularly well.

An organic antireflection coating (ARC) layer is frequently part of a semiconductor structure, where the ARC layer overlies a layer of a silicon-containing material, such as polysilicon, which further overlies a gate dielectric layer. In order to avoid significant overetching of the ARC layer and pitting of the underlying polysilicon layer, the second source gas preferably provides a selectivity of at least 10:1 for etching the organic coating layer relative to polysilicon. (The term "selectivity" is typically used to refer to a ratio of etch rates of two materials.) It is important to avoid pitting of the polysilicon layer, because this pitting will transfer directly to the underlying (thin) dielectric layer during subsequent polysilicon layer etching and may cause a punch-through of the thin dielectric layer.

The chemistry and process conditions used in the main etch step produce a greater negative CD shift in dense feature areas than in isolated feature areas. The overetch chemistry and process conditions produce a greater negative CD shift in isolated feature areas than in dense feature areas, on the substrate. The main etch and the overetch thus counteract each other, resulting in a reduced CD shift range across the substrate surface and providing improved critical dimension uniformity across the substrate surface.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a Centura® Integrated Processing System available from Applied Materials, Inc., of Santa Clara, Calif. The system is shown and described in U.S. Pat. No. 5,583,737 to Collins et al., the disclosure of which is hereby incorporated by reference. Although the etch process chamber used to process the substrates described in the Examples presented herein is shown in schematic in FIG. 1, any of the etch processors available in the industry should be able to take advantage of the etch chemistry described herein, with some adjustment to other process parameters.

The equipment shown in schematic in FIG. 1 includes a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996). FIG. 1 is a schematic of an individual CENTURA® DPS™ polysilicon etch chamber 102 of the type used in the Applied Materials' CENTURA® polysilicon etch system. The CENTURA® DPS™ polysilicon etch chamber 100 is configured to be mounted on a standard CENTURA® etch mainframe.

The CENTURA® DPS™ polysilicon etch chamber 100 consists of an upper chamber 104 having a ceramic dome 106, and a lower chamber 108. The lower chamber 108 includes a monopolar electrostatic chuck (ESC) cathode 110. Gas is introduced into the chamber via gas injection nozzles 114 for uniform gas distribution. Chamber pressure is controlled by a closed-loop pressure control system (not shown) with a throttle valve 118. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer located under a dielectric film on the chuck surface. The cathode 110 and substrate 120 are then raised by means of a wafer lift 124 and a seal is created against the upper chamber 104 in position for processing. Etch gases are introduced into the upper chamber 104 via the ceramic gas injection nozzles 114. The polysilicon etch chamber 100 uses an inductively coupled plasma source power 126 and matching network 128 operating at 12.56 MHZ which is connected to inductive coil 134 for generating and sustaining a high density plasma. The wafer is biased with an RF source 130 and matching network 132 operating at 13.56 MHZ. Power to the plasma source 126 and substrate biasing means 130 are controlled by separate controllers (not shown).

The temperature on the surface of the etch chamber walls is controlled using liquid-containing conduits (not shown) which are located in the walls of the etch chamber 100. The temperature of the semiconductor substrate is controlled by stabilizing the temperature of the electrostatic chuck cathode 110 upon which the substrate 120 rests. The helium gas is used to facilitate heat transfer between the substrate and the pedestal. During the etch process, the substrate 120 surface is gradually heated by the plasma to a steady state temperature which is approximately 10 to 40° C. higher than the substrate support platen temperature, depending on the process conditions. It is estimated that the substrate surface temperature was typically around 40° C. to 85° C. during most of our experiments. The surface of the etching chamber 100 walls was maintained at about 65° C. using the cooling conduits previously described. The ceramic dome 106 was maintained at a temperature of about 80° C.

When the end point of an etch is signaled by the etch reaching an interface with a different material, an endpoint subsystem (not shown) senses the end of the etch process by monitoring changes in the light emitted by the plasma in the etch chamber 100. Data is then displayed on a PC monitor. The operator sets an algorithm which controls the endpoint system.

Figure 1B:
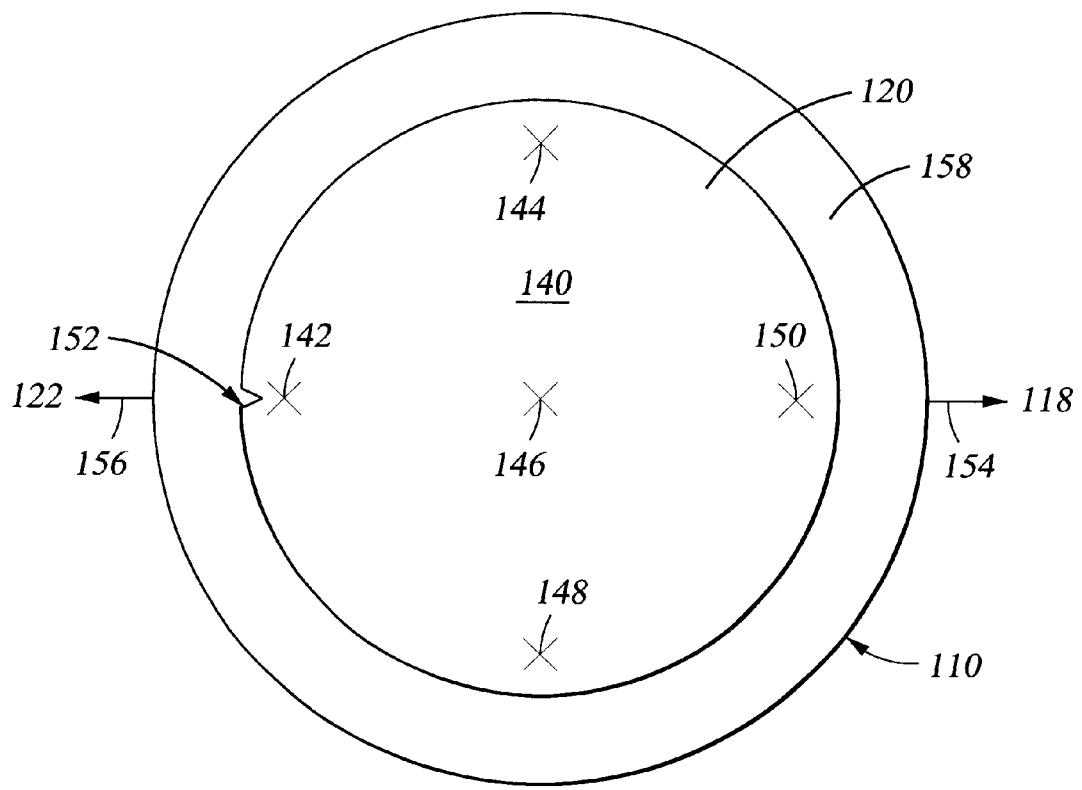
FIG. 1B shows a schematic of a substrate surface, indicating the bottom, left, center, right, and top locations of a substrate relative to the schematic of the processing apparatus shown in FIG. 1A.

FIG. 1B shows a schematic of a substrate 120 surface 140, including the bottom 142, left 144, center 146, right 148, and top 150 surface locations on substrate 120 (a silicon wafer in this case), relative to a notch 152 located at the bottom 142 of the substrate 120. These surface locations are shown, relative to the schematic of the processing apparatus 100 shown in FIG. 1B, where arrow 154 indicates the direction toward vacuum throttle valve 118, arrow 156 indicates the direction toward inlet 122, and substrate 120 is shown resting on upper surface 158 of electrostatic chuck 110.

Figure 8:
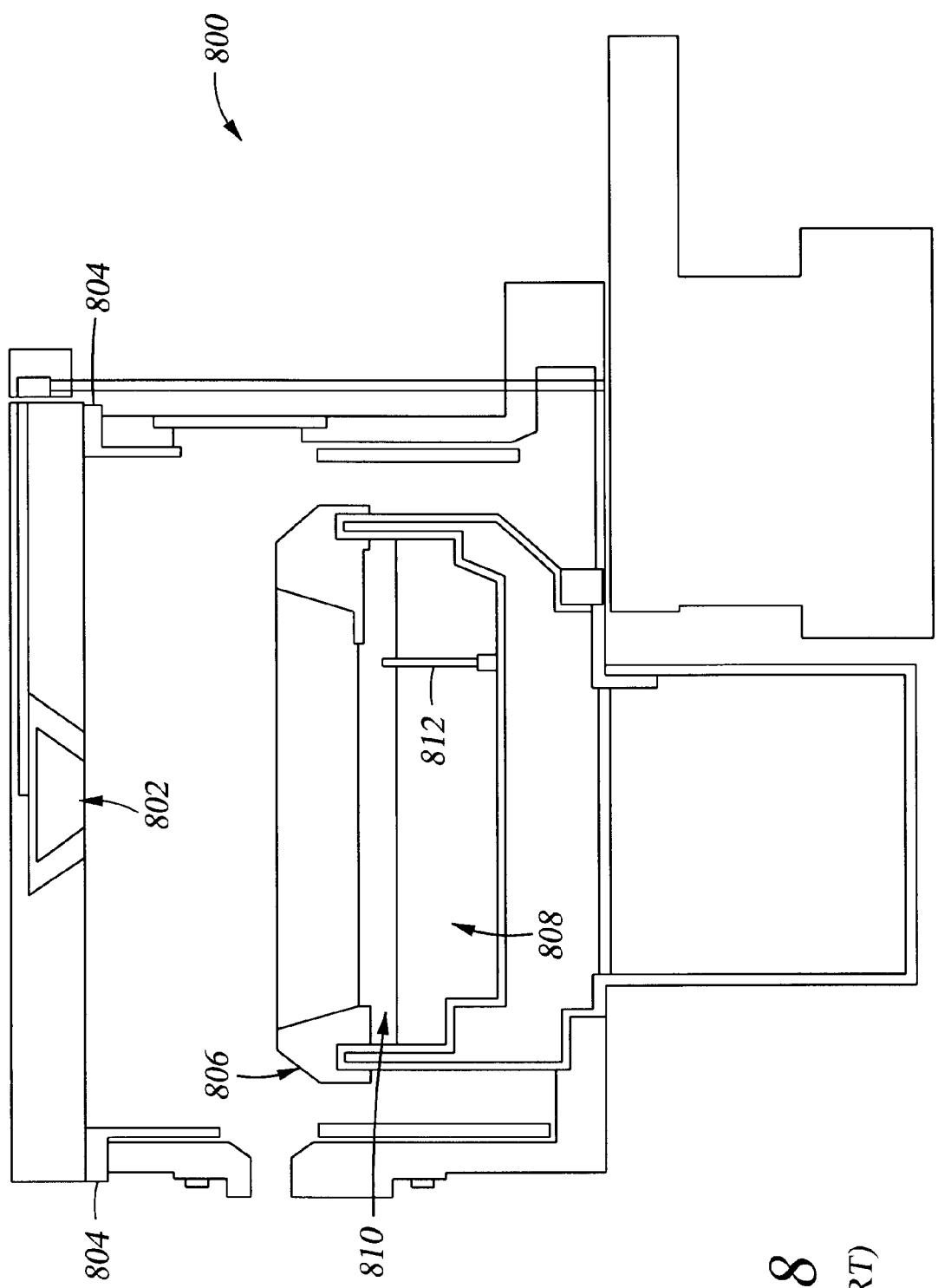
FIG. 8 is a schematic of an Applied Materials' MXP+ polysilicon etch chamber, which is an alternative example of an apparatus of the kind which can be used to carry out the etching processes described herein.

Alternatively, the method of the invention may be performed in an etch processing apparatus wherein power to a plasma generation source and power to a substrate biasing means are controlled by a single power control, such as the Applied Materials' MXP or MXP+ polysilicon etch chamber. FIG. 8 is a schematic of an Applied Materials' MXP+ polysilicon etch chamber 800, which is a parallel plate plasma etch chamber of the kind which is well-known in the art. The MXP+ polysilicon etch chamber offers advantages over other similar etch chambers in that it includes a simplified, two-dimensional gas distribution plate 802, which allows for more uniform gas distribution throughout the chamber. Another modification is a removable aluminum chamber liner 804, which can be easily removed and replaced during each wet cleaning procedure, allowing for a more rapid cleaning cycle. Yet another modification is an improved focus ring 806, which moves together with (rather than independently from) the cathode 808, resulting in reduced particle generation due to fewer moving parts within the apparatus. The high temperature cathode 808 has independent temperature control (not shown), which functions in response to a temperature reading from pedestal temperature probe 812, which permits operation at a temperature in excess of the process chamber temperature. The substrate to be processed (not shown) rests on an electrostatic chuck pedestal 810, which is joined to cathode 808.

II. The Method of the Invention for Etching Organic Antireflection Coating (ARC) Layers Prior to performing the method of the invention, one must first provide a starting etch stack. A typical etch stack is described below.

Figure 2A:
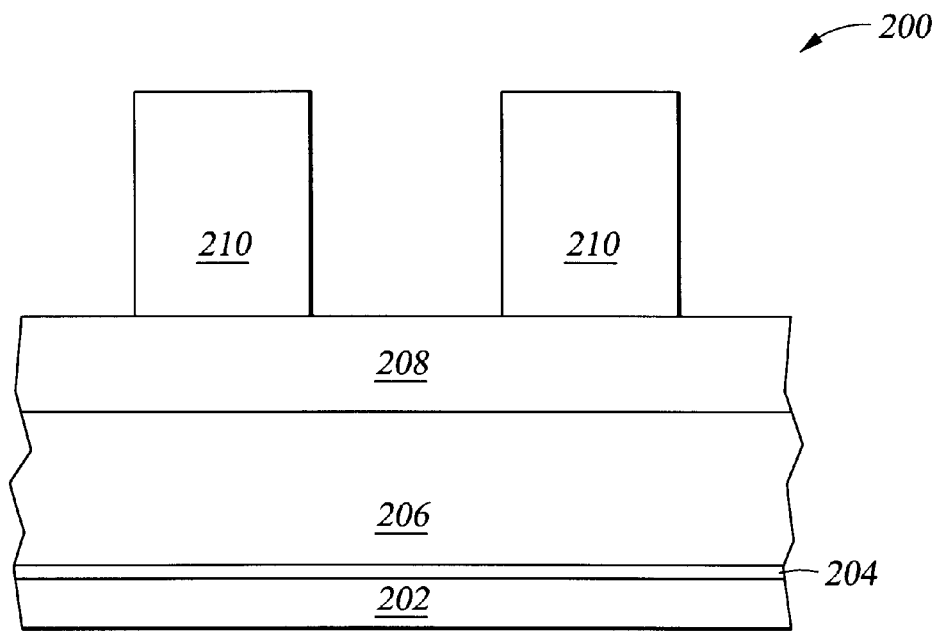
FIG. 2A shows an etch stack 200 which represents a starting structure of the kind upon which the method of the present invention is performed. The etch stack 200 includes, from top to bottom, a patterned layer 210 of photoresist, an organic antireflection coating (ARC) layer 208, a polysilicon layer 206, and a silicon oxide gate dielectric layer 204, all deposited on a silicon substrate 202. The relative thicknesses of the film stack layers are not shown to scale.

FIG. 2A shows an etch stack 200 which represents a starting structure of the kind upon which the method of the present invention is performed. The pattern is one of lines and spaces, and FIG. 2A illustrates a cross-sectional schematic of these lines and spaces.

Etch stack 200 includes the following layers, from top to bottom: a patterned layer 210 of photoresist; an organic antireflection coating (ARC) layer 208; a silicon-containing layer 206; and a gate dielectric layer 204, all deposited on a substrate 202.

The thickness and patterning method for the photoresist layer 210 will depend on the particular photoresist material used and the pattern to be imaged in the photoresist. Photoresist layer 210 may be any suitable photoresist material known in the art. Typically, the photoresist is an organic, carbon-containing material. Frequently, a deep ultra-violet (DUV) photoresist is used to transfer a pattern to a substrate. A typical film thickness for such a DUV photoresist ranges from about 4000 Å to about 6000 Å. In the starting etch stack etched in the Examples below, the photoresist 210 was a DUV photoresist having a thickness of about 6000 Å. DUV photoresists are available from either JSR® or SHIPLEY®, INC., for example, and not by way of limitation.

An ARC layer is frequently required when a DUV photoresist is used, to reduce standing waves and back-scattered light in general during the photoresist imaging process. Organic ARCs are preferred in some instances because they are more compatible with photoresists. The organic ARC layer 208 may be formed from any of the organic ARC materials known in the art, using conventional methods known in the art, such as a spin-on technique. The organic ARC layer 208 typically has a thickness within the range of about 300 Å to about 3000 Å. In the starting etch stack etched in the Examples below, the organic ARC layer 208 had a thickness of about 2000 Å.

The silicon-containing layer 206 is typically polysilicon or amorphous silicon. If desired (such as to provide a low resistance gate structure), the silicon-containing layer 206 may be doped. The silicon-containing layer 206 is typically formed to have a thickness within the range of about 1500 Å to about 3000 Å. In the starting etch stack etched in the Examples below, the silicon-containing layer 206 was polysilicon, which was deposited using a chemical vapor deposition (CVD) technique known in the art. Polysilicon layer 206 had a thickness of about 2000 Å.

Underlying polysilicon layer 206 is a thin gate dielectric layer 204, which is typically an inorganic oxide, such as silicon oxide, silicon oxynitride, or tantalum pentoxide, for example. Alternatively, the gate dielectric layer may be an organic dielectric, such as a Poly(arylene)ether, a Polyl (arylene)ether oxazole, Parylene-N, a Polyimide, Polynaphthalene-N, a Polyphenyl-Quinoxaline, a Polybenzoxazole, Polyindane, Polynorborene, Polyphenyleneoxide, or an αC, for example.

A silicon oxide gate dielectric layer 204 is typically formed to have a thickness within the range of about 15 Å to about 100 Å. Other materials having different electrical properties may be applied at a different thickness. For example, in the starting etch stack etched in the Examples below, the gate dielectric layer 204 was silicon oxide, which had a thickness of about 60 Å. When tantalum pentoxide is used, the thickness of the gate dielectric layer may be lower than when silicon oxide is used. Such gate dielectric layers are typically formed or deposited using conventional methods known in the art, such as thermal oxidation or plasma-enhanced chemical vapor deposition (PECVD).

The substrate 202 is typically silicon, but may alternatively be glass or silicon-on-insulator (SOI), for example. When the substrate is silicon, the silicon-containing layer 206 may be either polysilicon or amorphous silicon. However, when a glass substrate is used, the silicon-containing layer 206 must be amorphous silicon, because, in order to form polysilicon, an underlying silicon substrate is needed as a seed layer. Amorphous silicon can be deposited using conventional physical vapor deposition (PVD) or chemical vapor deposition (CVD) techniques.

Figure 2B:
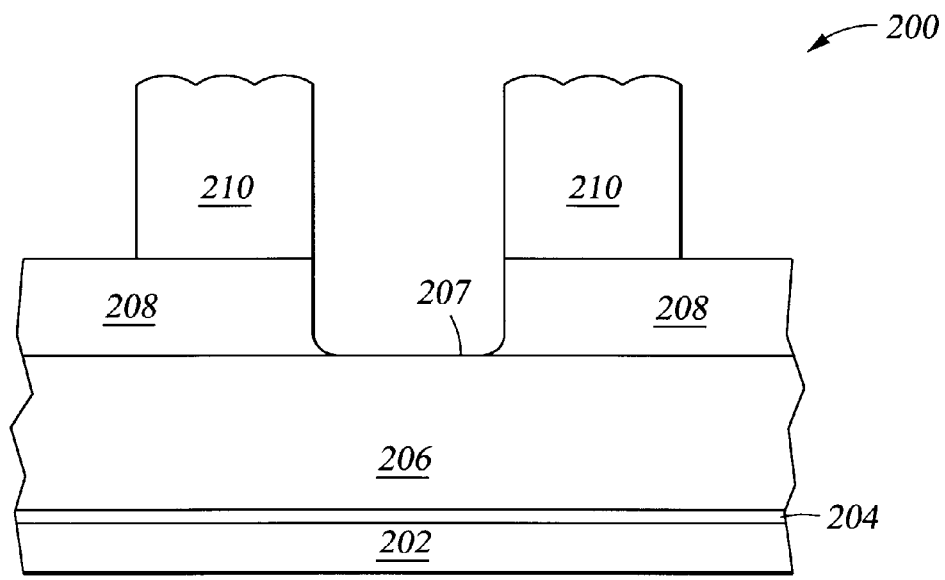
FIG. 2B shows the etch stack 200 after performance of the main etch step according to the method of the invention. The entire thickness of the ARC layer 208 has been etched to endpoint using a first plasma source gas, and an upper surface 207 of polysilicon layer 206 has been exposed. Residual ARC material overlies the polysilicon layer surface 207 on certain areas of the substrate surface.

According to one method of the invention, a main etch step is performed to etch through essentially the entire thickness of organic ARC layer 208, exposing an upper surface 207 of polysilicon layer 206, as illustrated in FIG. 2B. The main etch step preferably utilizes a plasma generated from a source gas comprising $CF_4$ and $Cl_2$. If needed, a minor amount of a passivating gas such as $N_2$ may be included in the first plasma source gas.

In an alternative, less preferred embodiment of the invention, a first source gas comprising $CF_4$, HBr, and $O_2$ can be used to perform the main etch step. Compatible process conditions for use with this chemistry are described in detail in commonly owned, copending U.S. application Ser. No. 09/611,085, of Shen et al., which is hereby incorporated by reference in its entirety.

The endpoint of the main etch step is detected using a an optical emission spectroscopy (OES) endpoint detection system, at a wavelength of 4390 Å.

Figure 2C:
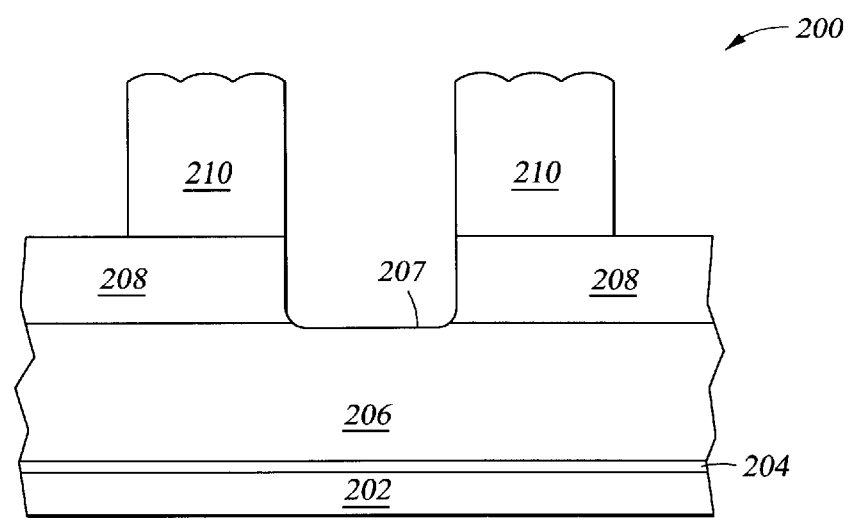
FIG. 2C shows the etch stack 200 after performance of the overetch step according to the method of the invention. Residual ARC material has been removed from the polysilicon layer surface 207, without any significant etching of the polysilicon layer.

Referring to FIG. 2C, an overetch step is then performed to remove residual ARC material which remains on poly-silicon layer surface 207 at the completion of the main etch step. The plasma source gas used in the overetch step preferably provides a selectivity of at least 10:1 for etching the organic ARC layer 208 relative to polysilicon layer 206, in order to avoid significant overetching with the potential of pitting the surface of the polysilicon layer 206. If the surface 207 of polysilicon layer 206 is pitted, this pitting may transfer to the underlying gate dielectric layer 204. We have found that a plasma generated from a chlorine-comprising gas, an oxygen-comprising gas, and an inert gas (i.e., a noble gas) provides a selectivity of at least 20:1 for etching an organic ARC material relative to polysilicon.

Typical process condition ranges for the main etch and overetch steps are provided in Table One, below.

TABLE ONE

Typical Process Conditions for Organic ARC Layer Main Etch and Overetch

| Process Condition | Main Etch | Overetch |
|---|---|---|
| Total Gas Flow (sccm) | 100–200 | 50–200 |
| $CF_4$ (sccm) | 50–150 | — |
| $Cl_2$ (sccm) | 10–100 | 10–100 |
| $N_2$ (sccm) | 0–50 | — |
| $O_2$ (sccm) | — | 10–50 |
| Argon (sccm) | — | 20–100 |
| Plasma Source Power (W) | 200–600 | 200–600 |
| Substrate Bias Power (W) | 30–90* | 20–60* |
| Process Chamber Pressure (mTorr) | 3–10 | 3–10 |
| Substrate Temp. (°C.) | 30–65 | 30–65 |
| Etch Time (sec) | 30–120 | 5–40 |
| Plasma Density ($e^-/cm^3$) | $\geq 1 \times 10^{11}$ | $\geq 1 \times 10^{11}$ |

*Where the substrate biasing power applied in the overetch step is lower than the substrate biasing power applied in the main etch step.

III. EXAMPLES

The experiments described in the Examples below were performed using the etch stack 200 shown in FIG. 2A, as follows (layers listed from top to bottom): a 6000 Å DUV photoresist layer 210 (previously patterned); a 2000 Å organic ARC layer 208; a 200 Å polysilicon layer 206; and a 60 Å silicon oxide gate dielectric layer 204, all deposited on a silicon substrate 202. The etch stack was prepared using conventional techniques known in the art, as described above.

COMPARATIVE EXAMPLE ONE

The ARC layer 208 was etched using a plasma source gas of $CF_4$, HBr, and $O_2$. Process conditions, such as gas flow rates and bias power, were varied between experiments. The plasma source gas used during Run #3 also included $N_2$; the plasma source gas used during Run #4 included argon (rather than nitrogen).

Table Two provides experimental process conditions and critical dimension data generated during etching of the ARC layer.

TABLE TWO

BARC Etching Using $CF_4$, HBr, and $O_2$

| Run # | 1 | 2 | 3 | 4 | 5 | 6 |
|---|---|---|---|---|---|---|
| $CF_4$ (sccm) | 60 | 60 | 60 | 30 | 60 | 80 |
| HBr (sccm) | 20 | 20 | 20 | 10 | 20 | 20 |
| $O_2$ (sccm) | 40 | 40 | 40 | 20 | 20 | 40 |

TABLE TWO-continued

BARC Etching Using $CF_4$, HBr, and $O_2$

| Run # | 1 | 2 | 3 | 4 | 5 | 6 |
|---|---|---|---|---|---|---|
| $N_2$ (sccm) | — | — | 30 | — | — | — |
| Ar (sccm) | — | — | — | 60 | — | — |
| Source Power (W) | 300 | 300 | 300 | 300 | 300 | 300 |
| Bias Power (W) | 90 | 75 | 90 | 90 | 90 | 90 |
| Chamber Pressure (mTorr) | 4 | 4 | 4 | 4 | 4 | 4 |
| Endpoint* (sec) | 38.0 | 43.1 | 42.8 | 45.6 | 47.2 | 41.6 |
| Overetch (sec) | 7.6 | 8.6 | 8.5 | 9.1 | 9.4 | 8.3 |
| Average CD Shift (nm) | −44.4 | −51.9 | −45.6 | −37.8 | −22.5 | −39.9 |
| CD Shift Range (nm) | 14.8 | 13.3 | 13.6 | 15.8 | 20.8 | 14 |

*Endpoint determined by optical emission spectroscopy (OES).

Referring to Table Two, above, the term "CD shift" refers to the difference between the line width of the etched ARC and the line width in the photoresist used to pattern the ARC. Thus, a positive CD shift indicates that the etched CD is larger than the pattern CD prior to etch. A negative CD shift (also referred to as "CD loss") indicates that the etched CD is smaller than the pattern CD prior to etch. "Average CD shift" refers to an average of CD shift measurements taken at various locations (e.g., top, center, bottom) on the substrate and for various feature spacings (dense vs. isolated).

"CD shift range" refers to the difference between the highest measured CD shift and the lowest measured CD shift, and is an indication of CD uniformity across the substrate surface. Variations in CD shift (indicated by the CD shift range) may be attributable to either geographic considerations (i.e., the location on the substrate surface) or demographic considerations (i.e., the spacing between the lines being etched) While it is highly desired to have a minimal CD shift, it is critical that the CD shift be consistent between different substrate locations and different feature spacings. If the CD shift (i.e., the difference between the line width of the etched ARC and the line width in the photoresist used to pattern the ARC) is relatively high, but the variation in CD shift (CD shift range) is low, this means that etching is occurring consistently across the substrate surface, and the etching process can be adjusted to compensate for the CD shift. However, it is very difficult to compensate for a high variation in CD shift, which signifies that the etching process is not consistent across the substrate surface.

Figure 3:
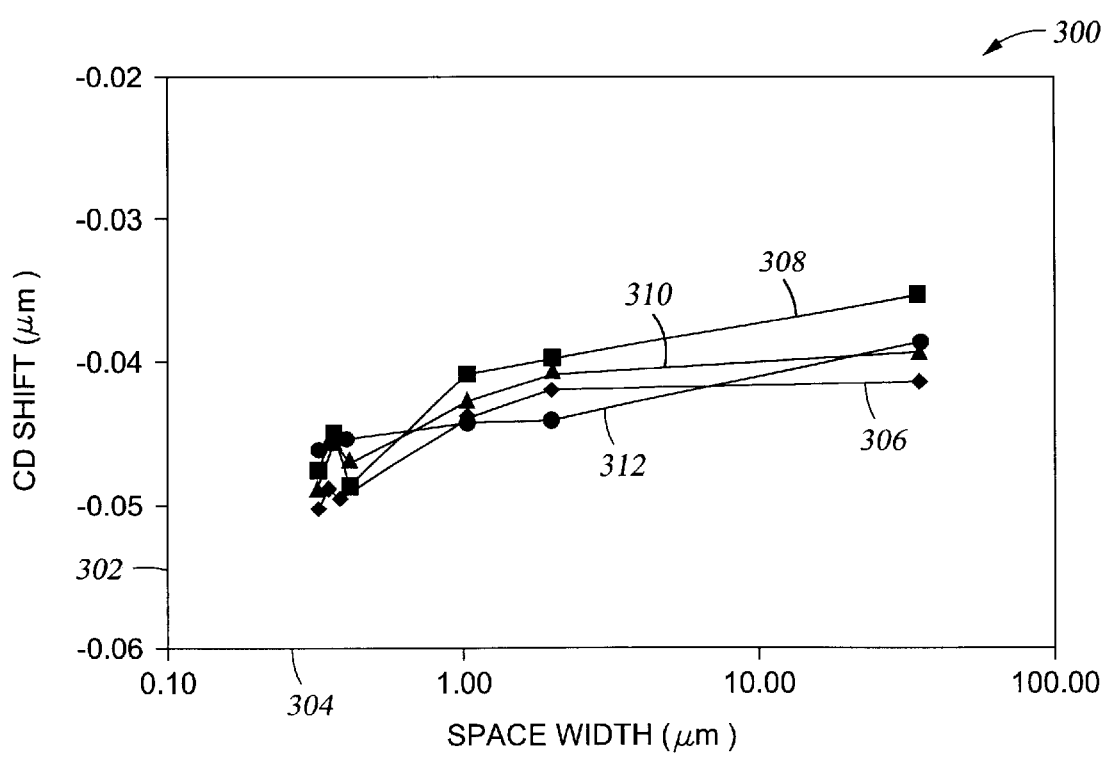
FIG. 3 shows a graph 300 of the shift 302 in critical dimension of the etched feature (i.e., the difference between the line width of the etched ARC and the line width in the photoresist used to pattern the ARC) as a function of the spacing 304 between etched features, at various locations on a substrate surface, when a plasma source gas of $CF_4$, HBr, and $O_2$ was used to etch the organic ARC layer.

FIG. 3 shows a graph 300 of the shift in critical dimension of the etched feature as a function of the spacing between etched features, for Run #1. The shift in critical dimension (in $\mu$m) is shown on the axis labeled 302, for an etched line in a pattern of lines and spaces. The shift in critical dimension is shown as a function of the spacing between the lines (in $\mu$m), on the axis numbered 304. There are four plots on the graph: plot 306 represents a bottom location on a substrate, plot 308 represents a location on the left side of the substrate, plot 310 represents a center location on the substrate, and plot 312 represents a top location on the substrate, as illustrated with reference to FIG. 1B.

Graph 300 makes it possible to look at the variation in critical dimension shift which is attributable to the location on the substrate surface and the variation in critical dimension shift which is attributable to differences in spacing between the lines being etched. Referring to FIG. 3, it is easy to see that the CD shift due to differences in spacing is much greater than the CD shift due to location on the substrate surface. The highest CD shift appears to be about −0.050 $\mu$m, and the lowest CD shift appears to be about −0.035 $\mu$m, for a CD shift range of approximately 0.015 $\mu$m (measured value: 14.8 nm). The average critical dimension shift was −44.4 nm. There is a trend toward greater CD loss in dense areas (i.e., areas having smaller space widths) of the substrate.

Due to the size reduction in semiconductor device structures, device fabricators are looking for a critical dimension shift variation (CD shift range) across the substrate (CD uniformity) of about 10 nm (0.01 $\mu$m) or less. An average CD shift of 30 nm (0.03 $\mu$m) or less is also desired. As indicated in Table Two, none of the combinations of plasma source gas composition and process conditions used during Runs #1–6 provided both the desired CD shift range and an acceptable average CD shift. In fact, there appeared to be a trade-off between average CD shift and CD shift range. As the average CD shift decreased, the CD uniformity across the substrate (as indicated by CD shift range) worsened (refer to Run #5). When the CD shift range was relatively low (indicating acceptable uniformity), the average CD shift was unacceptably high (refer to Run #2).

Figure 4:
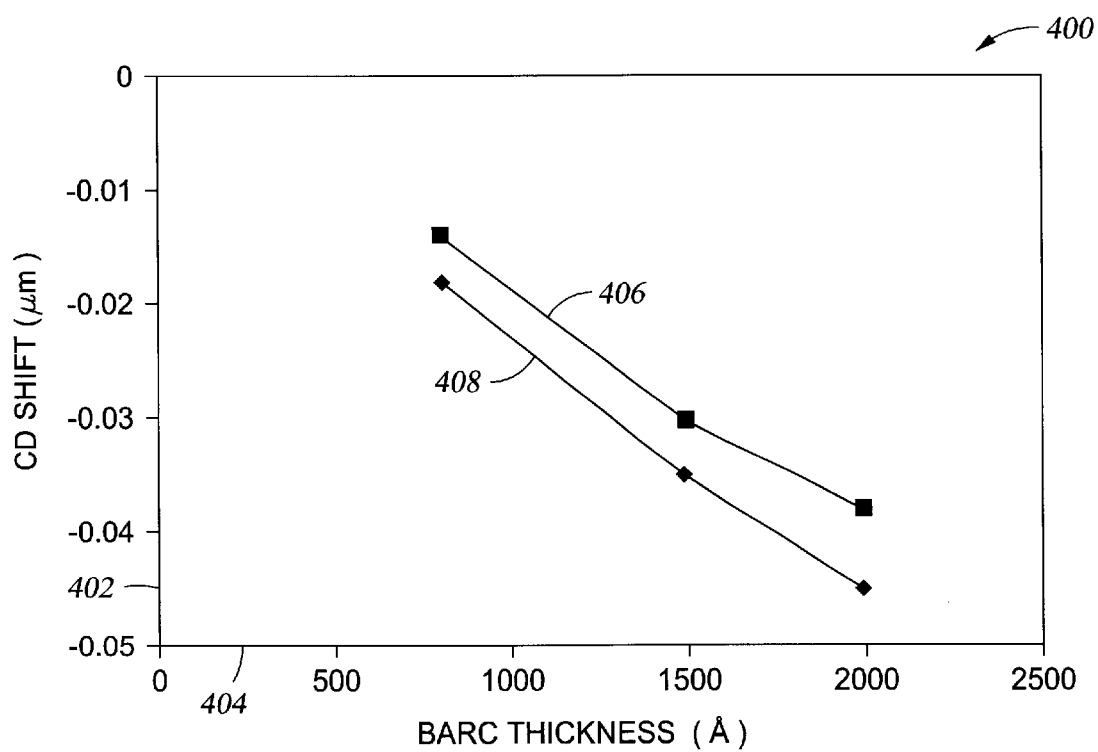
FIG. 4 shows a graph 400 of the shift 402 in critical dimension of the etched feature (as measured in dense and isolated areas of the substrate) as a function of the thickness 404 of the BARC layer, when a plasma source gas of $CF_4$, HBr, and $O_2$ was used to etch the organic ARC layer.

FIG. 4 shows a graph 400 of the shift in critical dimension of the etched feature as a function of the thickness of the BARC layer, for Run # 1. The shift in critical dimension (in $\mu$m) is shown on the axis labeled 402, for an etched line in a pattern of lines and spaces. The shift in critical dimension is shown as a function of the thickness of the BARC layer (in Å), on the axis numbered 404. There are two plots on the graph: plot 406 represents isolated lines on the substrate, and plot 408 represents a dense array of lines. As shown in FIG. 4, CD shift was acceptable ($\leq 0.03$ $\mu$m) when thinner BARC layers were etched. However, CD shift in both dense and isolated areas of the substrate increased as the thickness of the BARC layer increased above 1500 Å. This is believed to be due to the longer etch time needed to etch through a thicker BARC layer. It should also be noted that there is an increasing divergence between isolated 406 and dense 408 lines as the BARC layer thickness increases, indicating a worsening CD shift range.

EXAMPLE TWO

Upon reviewing the critical dimension data obtained for BARC etching using a plasma source gas of $CF_4$, HBr, and $O_2$, we determined that a new BARC etch process that would provide acceptable CD shift and CD uniformity during etching of thicker (i.e., greater than 1500 Å) BARC layers was needed.

The ARC layer 208 of the etch stack shown in FIG. 2A and described above was etched using a plasma source gas of $CF_4$, $Cl_2$, and $N_2$. Process conditions, such as plasma source power and bias power, were varied between experiments. The plasma source gas used during Run #13 also included argon; the plasma source gas used during Run #12 did not include $N_2$.

Table Three provides experimental process conditions and critical dimension data generated during etching of the ARC layer.

TABLE THREE

BARC Etching Using $CF_4$, $Cl_2$, and $N_2$

| Run # | 7 | 8 | 9 | 10 | 11 | 12 | 13 | 14 |
|---|---|---|---|---|---|---|---|---|
| $CF_4$ (sccm) | 100 | 100 | 100 | 100 | 100 | 100 | 100 | 100 |
| $Cl_2$ (sccm) | 20 | 20 | 20 | 20 | 20 | 20 | 20 | 20 |
| $N_2$ (sccm) | 20 | 20 | 20 | 20 | 20 | 0 | 20 | 20 |
| Ar (sccm) | — | — | — | — | — | — | 10 | — |
| Source Power (W) | 315 | 315 | 500 | 315 | 250 | 315 | 315 | 315 |
| Bias Power (W) | 50 | 50 | 50 | 90 | 40 | 50 | 50 | 30 |
| Chamber Pressure (mTorr) | 4 | 4 | 4 | 4 | 4 | 4 | 4 | 4 |
| Endpoint* (sec) | 62 | 64.8 | 52 | 49.3 | 78.2 | 52 | 59 | 76.6 |
| Overetch (sec) | 18 | 12.9 | 11 | 9.8 | 15.6 | 20 | 8 | 15.3 |
| Average CD Shift (nm) | −19.2 | −16.2 | −22.2 | 4.5 | −16.4 | −18.5 | −21.8 | −25.8 |
| CD Shift Range (nm) | 17.2 | 18 | 23.3 | 44.7 | 18.3 | 15.9 | 18.9 | 15.7 |

*Endpoint determined by optical emission spectroscopy (OES).

As indicated in Table Three, none of the combinations of plasma source gas composition and process conditions used during Runs #7–14 provided both the desired CD shift range (≦10 nm) and an acceptable average CD shift (≦30 nm). As also observed in Runs #1–6, there appeared to be a trade-off between average CD shift and CD shift range. As the average CD shift decreased, the CD uniformity (as indicated by CD shift range) worsened (refer to Run #10). When the CD shift range was relatively low (indicating acceptable uniformity), the average CD shift was unacceptably high (refer to Run #14).

Figure 5:
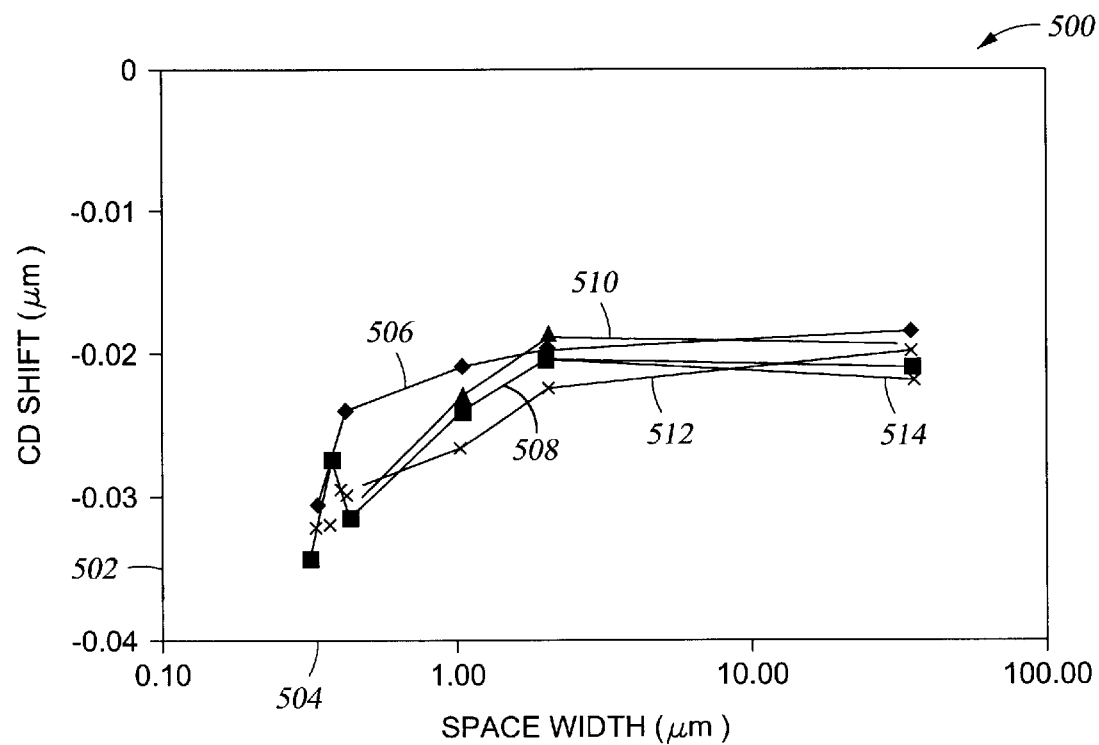
FIG. 5 shows a graph 500 of the shift 502 in critical dimension of the etched feature as a function of the spacing 504 between etched features, at various locations on a substrate surface, when a plasma source gas of $CF_4$, $Cl_2$, and $N_2$ was used to etch the organic ARC layer.

FIG. 5 shows a graph 500 of the shift in critical dimension of the etched feature as a function of the spacing between etched features, for Run #14. The shift in critical dimension (in µm) is shown on the axis labeled 502, for an etched line in a pattern of lines and spaces. The shift in critical dimension is shown as a function of the spacing between the lines (in µm), on the axis numbered 504. There are five plots on the graph: plot 506 represents a bottom location on a substrate, plot 508 represents a location on the left side of the substrate, plot 510 represents a center location on the substrate, plot 512 represents a location on the right side of the substrate, and plot 514 represents a top location on the substrate.

Again, the CD shift due to differences in spacing is much greater than the CD shift due to location on the substrate surface. The CD shift range was 15.7 nm, with an average CD shift of −25.8. Again, there was a trend toward greater CD loss in dense areas (i.e., areas having smaller space widths between features) of the substrate.

EXAMPLE THREE

We decided to investigate the use of a chlorine and oxygen-based plasma for etching organic BARC layers. The experiment summarized in Table Four, below, utilized a plasma source gas of $Cl_2$, $O_2$, and argon.

TABLE FOUR

BARC Etching Using $Cl_2$, $O_2$, and Argon

| Run # | 15 |
|---|---|
| $Cl_2$ (sccm) | 18 |
| $O_2$ (sccm) | 18 |
| Ar (sccm) | 20 |
| Source Power (W) | 210 |
| Bias Power (W) | 33 |
| Chamber Pressure (mTorr) | 3 |
| Endpoint* (sec) | 74.7 |
| Overetch (sec) | 15 |
| Average CD Shift (nm) | −26.6 |
| CD Shift Range (nm) | 18.6 |

*Endpoint determined by optical emission spectroscopy (OES).

Figure 6:
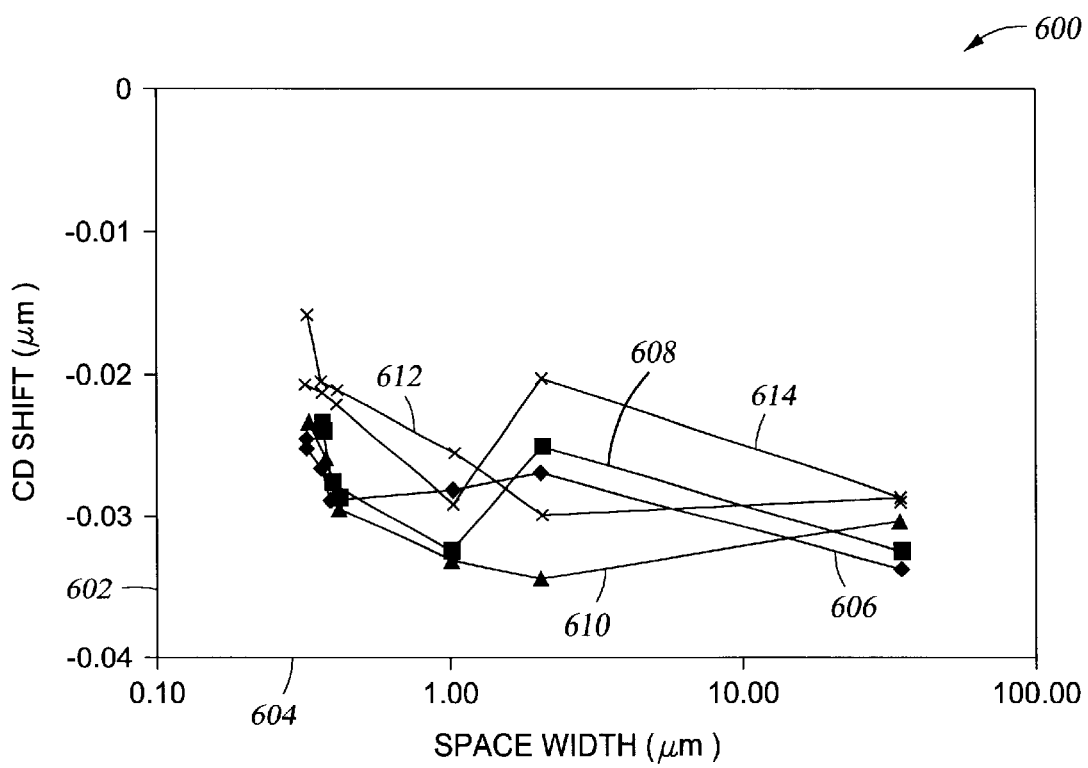
FIG. 6 shows a graph 600 of the shift 602 in critical dimension of the etched feature as a function of the spacing 604 between etched features, at various locations on a substrate surface, when a plasma source gas of $Cl_2$, $O_2$, and Ar was used to etch the organic ARC layer.

FIG. 6 shows a graph 600 of the shift in critical dimension of the etched feature as a function of the spacing between etched features, for Run #15. The shift in critical dimension (in µm) is shown on the axis labeled 602, for an etched line in a pattern of lines and spaces. The shift in critical dimension is shown as a function of the spacing between the lines (in µm), on the axis numbered 604. There are five plots on the graph: plot 606 represents a bottom location on a substrate, plot 608 represents a location on the left side of the substrate, plot 610 represents a center location on the substrate, plot 612 represents a location on the right side of the substrate, and plot 614 represents a top location on the substrate.

The CD shift range was 18.6 nm, with an average CD shift of 26.6. However, the use of the $Cl_2/O_2/Ar$ etch chemistry in Run #15 resulted in a trend toward greater CD loss in isolated areas (i.e., areas having larger space widths between features) of the substrate, which was the opposite of the trend toward greater CD loss in dense areas observed when either the $CF_4/HBr/O_2$ (Runs #1–6) or $CF_4/Cl_2/N_2$ (Runs #7–14) etch chemistries were used.

The $Cl_2/O_2/Ar$ etch chemistry provided excellent (>20:1) selectivity for etching the BARC layer 208 relative to the underlying polysilicon layer 206.

EXAMPLE FOUR

The next set of experiments involved using a first etch chemistry for the BARC main etch, followed by a second etch chemistry for the overetch step. The main BARC etch utilized a plasma source gas of $CF_4$ and $Cl_2$, optionally in combination with $N_2$ (in Runs #16–18). The overetch step utilized a plasma source gas of $Cl_2$, $O_2$, and argon. Process conditions, such as gas flow rates, plasma source power, and bias power, were varied between experiments.

Table Five provides experimental process conditions for both the main BARC etch and overetch steps, as well as critical dimension data generated during etching of the ARC layer.

TABLE FIVE

BARC Etching Using $CF_4/Cl_2$ Main Etch and $Cl_2/O_2/Ar$ Overetch

| Run # | 16 | 17 | 18 | 19 | 20 | 21 | 22 |
|---|---|---|---|---|---|---|---|
| Main Etch Chemistry (sccm) | 100 $CF_4$ 20 $Cl_2$ 20 $N_2$ | 100 $CF_4$ 20 $Cl_2$ 20 $N_2$ | 100 $CF_4$ 20 $Cl_2$ 10 $N_2$ | 100 $CF_4$ 20 $Cl_2$ | 100 $CF_4$ 20 $Cl_2$ | 100 $CF_4$ 20 $Cl_2$ | 100 $CF_4$ 20 $Cl_2$ |
| Source Power (W) | 315 | 315 | 315 | 315 | 315 | 315 | 315 |
| Bias Power (W) | 30 | 30 | 50 | 50 | 60 | 50 | 50 |
| Chamber Pressure (mTorr) | 4 | 4 | 4 | 4 | 4 | 4 | 4 |
| Endpoint (sec) | 77.7 | 74.6 | 56.8 | 50.8 | 47.6 | 51.8 | 50.8 |
| Overetch Chemistry (sccm) | 18 $Cl_2$ 18 $O_2$ 20 Ar | 18 $Cl_2$ 18 $O_2$ 20 Ar | 18 $Cl_2$ 18 $O_2$ 20 Ar | 18 $Cl_2$ 18 $O_2$ 20 Ar | 18 $Cl_2$ 18 $O_2$ 20 Ar | 18 $Cl_2$ 12 $O_2$ 20 Ar | 18 $Cl_2$ 18 $O_2$ 20 Ar |
| Source Power (W) | 210 | 300 | 300 | 300 | 300 | 300 | 300 |
| Bias Power (W) | 33 | 30 | 30 | 30 | 30 | 30 | 30 |
| Chamber Pressure (mTorr) | 3 | 3 | 3 | 3 | 3 | 3 | 3 |
| Endpoint (sec) | 15 | 10 | 7 | 10 | 10 | 10 | 10 |
| Average CD Shift (nm) | −34.0 | −35.3 | −22.8 | −26.2 | −24.3 | −29.2 | −28.2 |
| CD Shift Range (nm) | 13.8 | 13.1 | 14.7 | 8.5 | 11.9 | 11.2 | 9.5 |

As discussed above, the $CF_4/Cl_2$ etch chemistry shows a trend toward greater CD loss in dense areas, whereas the $Cl_2/O_2/Ar$ etch chemistry shows a trend toward greater CD loss in isolated areas of the substrate. As shown in Table Five, above, the microloading trends of the main etch and overetch chemistries appear to compensate for each other, resulting in improved CD uniformities across the substrate. Runs #19 and 22 (which utilized the same plasma source gas composition and process conditions) provided average CD shifts of less than 30 nm and CD shift ranges of less than 10 nm.

Figure 7:
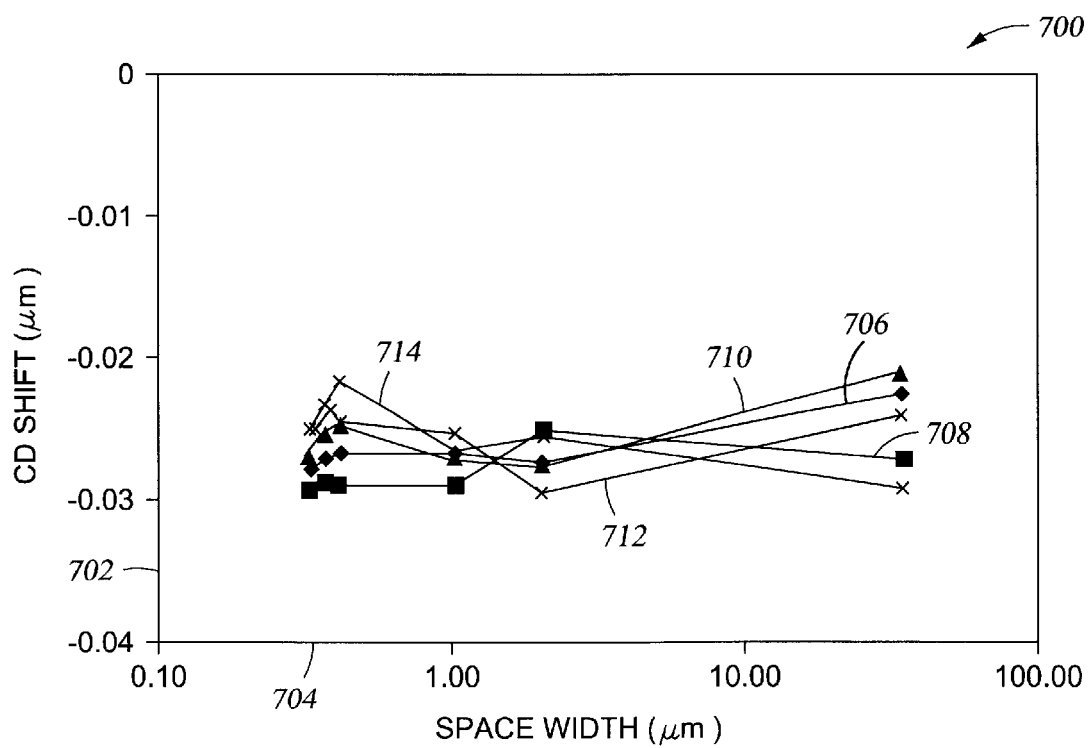
FIG. 7 shows a graph 700 of the shift 702 in critical dimension of the etched feature as a function of the spacing 704 between etched features, at various locations on a substrate surface, when a main etch chemistry of $CF_4$ and $Cl_2$, and an overetch chemistry of $Cl_2$, $O_2$, and Ar, were used to etch the organic ARC layer.

FIG. 7 shows the shift in critical dimension of the etched feature as a function of the spacing between etched features, for Run #19. The shift in critical dimension (in μm) is shown on the axis labeled 702, for an etched line in a pattern of lines and spaces. The shift in critical dimension is shown as a function of the spacing between the lines (in μm), on the axis numbered 704. There are five plots on the graph: plot 706 represents a bottom location on a substrate, plot 708 represents a location on the left side of the substrate, plot 710 represents a center location on the substrate, plot 712 represents a location on the right side of the substrate, and plot 714 represents a top location on the substrate.

The improved CD uniformity obtained using the ARC etch method of the invention can be clearly seen in the graph 700 in FIG. 7, when compared with the CD uniformity data shown in any of the preceding FIGS. 3, 4, 5, and 6.

The above described preferred embodiments are not intended to limit the scope of the present invention, as one skilled in the art can, in view of the present disclosure expand such embodiments to correspond with the subject matter of the invention claimed below.

We claim:

1. A method of etching a pattern in an organic coating layer overlying a semiconductor substrate, comprising the following steps:

a) a main etch step, wherein essentially the entire thickness of said organic coating layer is etched using a plasma generated from a first source gas comprising a fluorocarbon gas and a non-carbon-containing, halogen-comprising gas, and wherein a first bias is applied to said substrate during said main etch step; followed by b) an overetch step, wherein residual organic coating material remaining after said main etch step is removed by exposing said residual organic coating material to a plasma generated from a second source gas consisting essentially of a chlorine-comprising gas, an oxygen-comprising gas, and an inert gas, and wherein a second bias which is lower than said first bias is applied to said substrate during said overetch step.

2. The method of claim 1, wherein said fluorocarbon gas is selected from the group consisting of $CF_4$, $CHF_3$, $CH_2F_2$, $C_2F_6$, $C_4F_8$, and combinations thereof.

3. The method of claim 2, wherein said fluorocarbon gas is $CF_4$.

4. The method of claim 1, wherein said non-carbon-containing, halogen-comprising gas is selected from the group consisting of $Cl_2$, HBr, and HCl.

5. The method of claim 4, wherein said non-carbon-containing, halogen-comprising gas is $Cl_2$.

6. The method of claim 3, wherein said first source gas comprises $CF_4$ and $Cl_2$.

7. The method of claim 6, wherein a volumetric ratio of $CF_4:Cl_2$ in said first source gas ranges from about 1:1 to about 6:1.

8. The method of claim 6, wherein said first source gas further comprises a passivating gas selected from the group consisting of $N_2$ and HBr.

9. The method of claim 3, wherein said first source gas comprises $CF_4$, HBr, and $O_2$.

10. The method of claim 1, wherein said chlorine-comprising gas is selected from the group consisting of $Cl_2$ and HCl.

11. The method of claim 10, wherein said chlorine-comprising gas is $Cl_2$.

12. The method of claim 1, wherein said oxygen-comprising gas is $O_2$.

13. The method of claim 1, wherein said inert gas is selected from the group consisting of argon, helium, xenon, krypton, and combinations thereof.

14. The method of claim 13, wherein said inert gas is argon.

15. The method of claim 11, wherein said second source gas comprises $Cl_2$, $O_2$, and argon.

16. The method of claim 15, wherein a volumetric ratio of $Cl_2:O_2$ in said second source gas ranges from about 2:3 to about 3:1.

17. The method of claim 15, wherein argon comprises from about 20 volume % to about 80 volume % of said second source gas.

18. The method of claim 17, wherein argon comprises from about 30 volume % to about 50 volume % of said second source gas.

19. The method of claim 1, wherein said a substrate bias power used in said overetch step is less than a substrate bias power used in said main etch step.

20. The method of claim 19, wherein said substrate bias power used in said overetch step is 80% or less of said substrate bias power used in said main etch step.

21. The method of claim 1, wherein said organic coating layer is an antireflective coating (ARC) layer.

22. The method of claim 21, wherein said second source gas provides a selectivity of at least 20:1 for etching said ARC layer relative to an underlying silicon-containing layer.

23. The method of claim 22, wherein said underlying silicon-containing layer is polysilicon.

24. The method of claim 1, wherein said organic coating layer has a thickness of at least 1500 Å.

25. A method of etching an organic coating layer on a semiconductor substrate, comprising the following steps:
  a) a main etch step, wherein essentially the entire thickness of said organic coating layer is etched using a plasma generated from a first source gas, wherein etching is performed using a first substrate bias power, and wherein said main etch step provides a higher etch rate in dense feature areas of said substrate than in isolated feature areas of said substrate; and
  b) an overetch step, wherein residual organic coating material remaining after said main etch step is removed by exposing said substrate to a plasma generated from a second source gas, wherein etching is performed using a second substrate bias power which is less than said first substrate bias power, and wherein said overetch step provides a higher etch rate in isolated feature areas of said substrate than in dense feature areas of said substrate.

26. The method of claim 25, wherein said second substrate bias power is 80% or less of said first substrate bias power.

27. The method of claim 26, wherein said second substrate bias power is 70% or less of said first substrate bias power.

28. The method of claim 25, wherein said first source gas comprises a fluorocarbon gas and a non-carbon-containing, halogen-comprising gas.

29. The method of claim 28, wherein said first source gas comprises $CF_4$ and $Cl_2$.

30. The method of claim 29, wherein said first source gas further comprises a passivating gas selected from the group consisting of $N_2$ and HBr.

31. The method of claim 25, wherein said second source gas comprises a chlorine-comprising gas, an oxygen-comprising gas, and an inert gas.

32. The method of claim 31, wherein said second source gas comprises $Cl_2$, $O_2$, and argon.

33. The method of claim 25, wherein said organic coating layer is an antireflective coating (ARC) layer.

34. The method of claim 33, wherein said second source gas provides a selectivity of at least 20:1 for etching said ARC layer relative to an underlying silicon-containing layer.

35. The method of claim 34, wherein said underlying silicon-containing layer is polysilicon.

36. The method of claim 35, wherein said organic coating layer has a thickness of at least 1500 Å.

* * * * *